(12) United States Patent
Audette et al.

(10) Patent No.: US 7,084,651 B2
(45) Date of Patent: Aug. 1, 2006

(54) PROBE CARD ASSEMBLY

(75) Inventors: David M. Audette, Colchester, VT (US); David L. Gardell, Fairfax, VT (US); John F. Hagios, Williston, VT (US); Christopher L. Sullivan, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 19 days.

(21) Appl. No.: 10/710,677

(22) Filed: Jul. 28, 2004

(65) Prior Publication Data

US 2006/0022685 A1    Feb. 2, 2006

(51) Int. Cl.
*G01R 31/02* (2006.01)

(52) U.S. Cl. .................. 324/754; 324/758; 324/158.1

(58) Field of Classification Search ............... None
See application file for complete search history.

(56) References Cited

U.S. PATENT DOCUMENTS

| | | | |
|---|---|---|---|
| 4,772,846 A * | 9/1988 | Reeds | 324/758 |
| 5,180,977 A | 1/1993 | Huff | |
| 5,642,056 A | 6/1997 | Nakajima et al. | |
| 5,804,983 A | 9/1998 | Nakajima et al. | |
| 5,861,759 A | 1/1999 | Bialobrodski et al. | |
| 5,974,662 A | 11/1999 | Eldridge et al. | |
| 6,377,062 B1 | 4/2002 | Ramos et al. | |
| 6,441,629 B1 | 8/2002 | Khoury et al. | |
| 6,498,504 B1 * | 12/2002 | Miyagi | 324/754 |
| 6,507,751 B1 * | 1/2003 | Blume et al. | 600/424 |
| 6,600,334 B1 | 7/2003 | Hembree et al. | |
| 6,624,648 B1 | 9/2003 | Eldridge et al. | |
| 6,677,771 B1 | 1/2004 | Zhou et al. | |
| 2003/0038647 A1 | 2/2003 | Eldridge et al. | |
| 2003/0080764 A1 | 5/2003 | Zhou et al. | |

FOREIGN PATENT DOCUMENTS

WO    WO98/58266    * 6/1998

* cited by examiner

*Primary Examiner*—Jermele Hollington
*Assistant Examiner*—Jimmy Nguyen
(74) *Attorney, Agent, or Firm*—Schmeiser, Olsen & Watts; Anthony Canale

(57) ABSTRACT

A method and apparatus for testing, the apparatus including: a probe array mounted on an inner portion of a gimbaled bearing, the inner portion of the gimbaled bearing having a spherical surface defined by a surface of a first sphere between two parallel small circles of the first sphere, a radius of the first sphere centered on a point on a top surface of the probe array; and an outer portion of the gimbaled bearing, the outer portion of the gimbaled bearing having a spherical surface defined by the surface of a second sphere between two parallel small circles of the second sphere, a radius of the second sphere centered on the point on the top surface of the probe array.

31 Claims, 12 Drawing Sheets

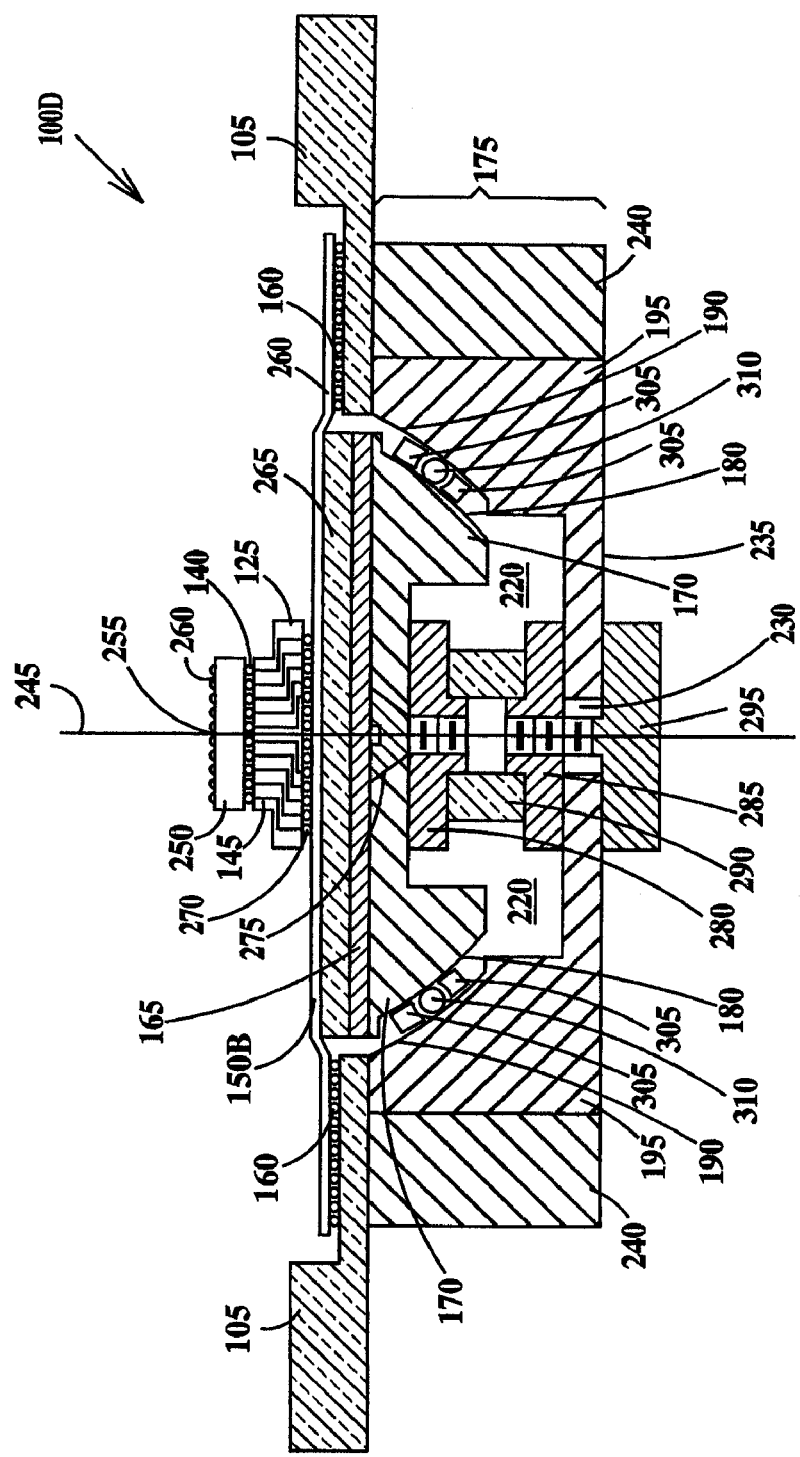
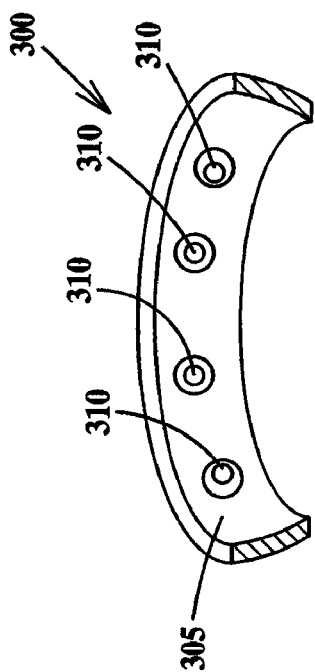
FIG. 5A
FIG. 5B

US 7,084,651 B2

PROBE CARD ASSEMBLY

BACKGROUND OF INVENTION

1. Field of the Invention

The present invention relates to the field of nondestructive integrated circuit testing; more specifically, it relates to probe card assembly for interconnecting an integrated circuit chip to a tester.

2. Background of the Invention

During integrated circuit wafer level test, individual integrated circuit chips, also called device(s) under test (DUT), are tested by temporarily contacting individual power and signal I/O connections, such as solder bumps, with probes mounted to a probe card assembly of a tester. As the number and density of I/Os increase it becomes increasingly difficult to ensure uniform and low resistance contact between the probes and each I/O connection. The probe card assembly plays a significant role in ensuring this contact. Therefore, there is a need for improved probe card assemblies.

SUMMARY OF INVENTION

A first aspect of the present invention is an apparatus, comprising: a probe array mounted on an inner portion of a gimbaled bearing, the inner portion of the gimbaled bearing having a spherical surface defined by a surface of a first sphere between two parallel small circles of the first sphere, a radius of the first sphere centered on a point on a top surface of the probe array; and an outer portion of the gimbaled bearing, the outer portion of the gimbaled bearing having a spherical surface defined by the surface of a second sphere between two parallel small circles of the second sphere, a radius of the second sphere centered on the point on the top surface of the probe array.

A second aspect of the present invention is a method of testing, comprising: providing a probe array; providing a gimbaled bearing, an inner portion of the gimbaled bearing having a spherical surface defined by the surface of a first sphere between two parallel small circles of the first sphere, a radius of the first sphere centered on a point on a top surface of the probe array, an outer portion of the gimbaled bearing having a spherical surface defined by the surface of a second sphere between two parallel small circles of the second sphere, a radius of the second sphere centered on the point on the top surface of the probe array; mounting the probe array on an inner portion of the gimbaled bearing; and contacting I/O connections of a device under test with the probe array.

A third aspect of the present invention is an apparatus, comprising: a probe array mounted on an inner portion of a bearing, the inner portion of the bearing slidably mounted to an outer portion of the bearing; the inner bearing able to move in a direction perpendicular to a top surface of the probe array; and means for dynamically adjusting a pressure of the probe array on I/O interconnects of a device under test.

A fourth aspect of the present invention is a method of testing, comprising: providing a probe array; providing a bearing, an inner portion of the bearing slidably mounted to an outer portion of the bearing; the inner bearing able to move in a direction perpendicular to a top surface of the probe array; providing means for dynamically adjusting a pressure of the probe array on I/O interconnects of a device under test; mounting the probe array to the inner portion of the bearing; and contacting I/O connections of a device under test with the probe array.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIG. 5A is a cross-section view of a probe card assembly according to a fourth embodiment of the present invention;

FIG. 5B is an isometric cross-section illustrating a ball bearing assembly of FIG. 5A;

DETAILED DESCRIPTION

Figure 1:
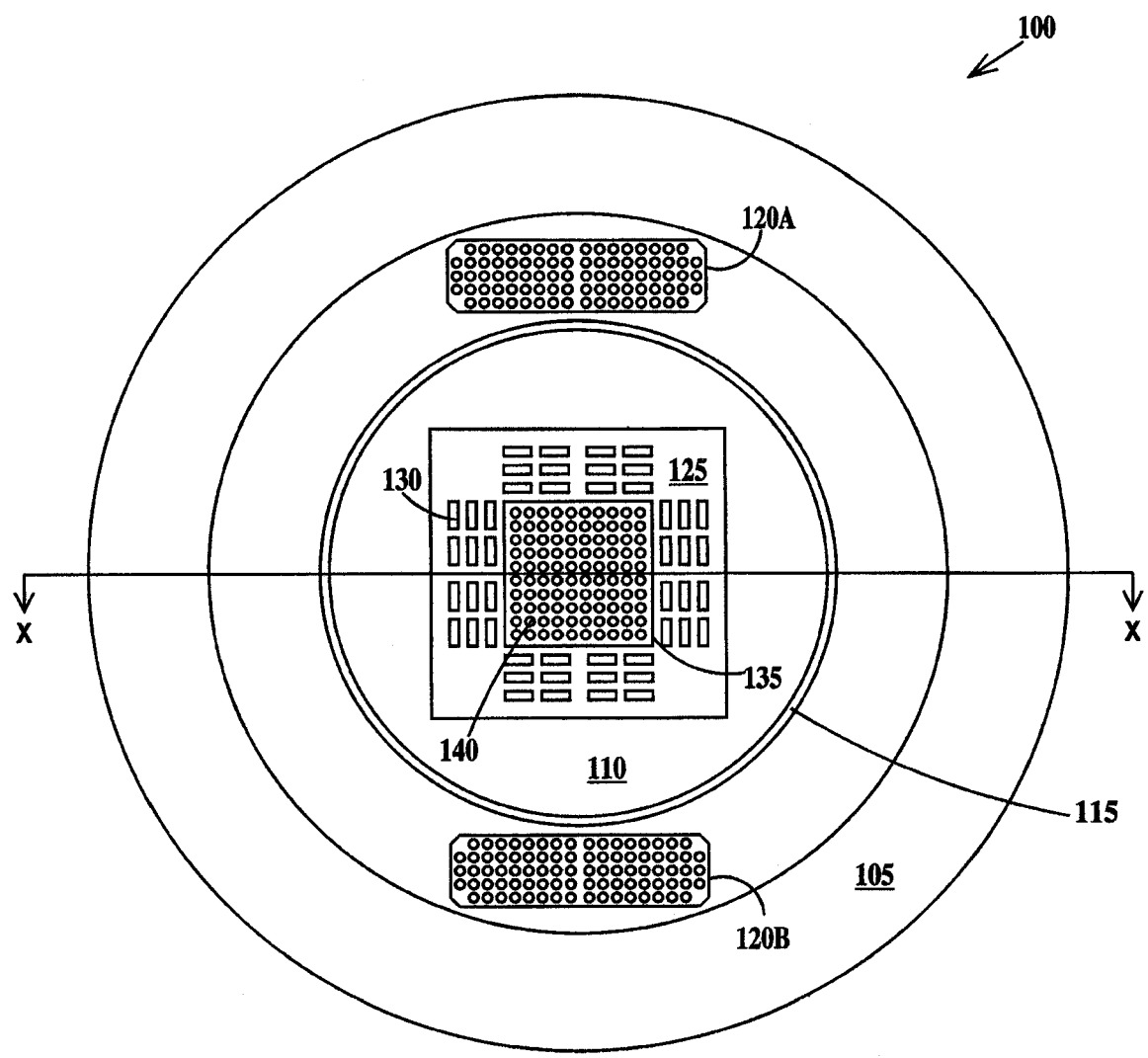
FIG. 1 is a top view of a probe card assembly according to the present invention.

FIG. 1 is a top view of a probe card assembly according to the present invention. In FIG. 1, a probe card assembly 100, includes a ring shaped outer probe card 105 and an inner disk shaped probe card 110. Inner probe card 110 is moveably mounted and centered in circular opening 115 of outer probe card 105. Outer probe card 105 includes multiple pin connectors 120A and 120B for connecting wires (not shown) embedded in outer probe card 110 to the test controller portion of a tester (see FIG. 12). Mounted to inner probe card 110 is a substrate 125. Mounted on substrate 125 are optional decoupling capacitors 130. Within substrate 125 is an array region 135. Array region 135 of substrate 125 includes an array of upper contacts 140 and may or may not be raised. Upper contacts 140 are electrically connected to wires (not shown) in inner probe card 110 by wires (see for example, FIG. 2A) in substrate 125 through pads (see for example, FIG. 2A) on the underside of substrate 125. In one example, outer probe card 105 and inner probe card 110 are printed circuit boards (PCB). Inner probe card 110 and outer probe card 105 are physically and electrical connected by a flexible circuit (not shown in FIG. 1, see for example, FIGS. 2A and 3).

The cross-section views of FIGS. 2A, 3, 4, 5, 6, 7, 8 and 9 are taken through line X—X of FIG. 1.

Figure 2:
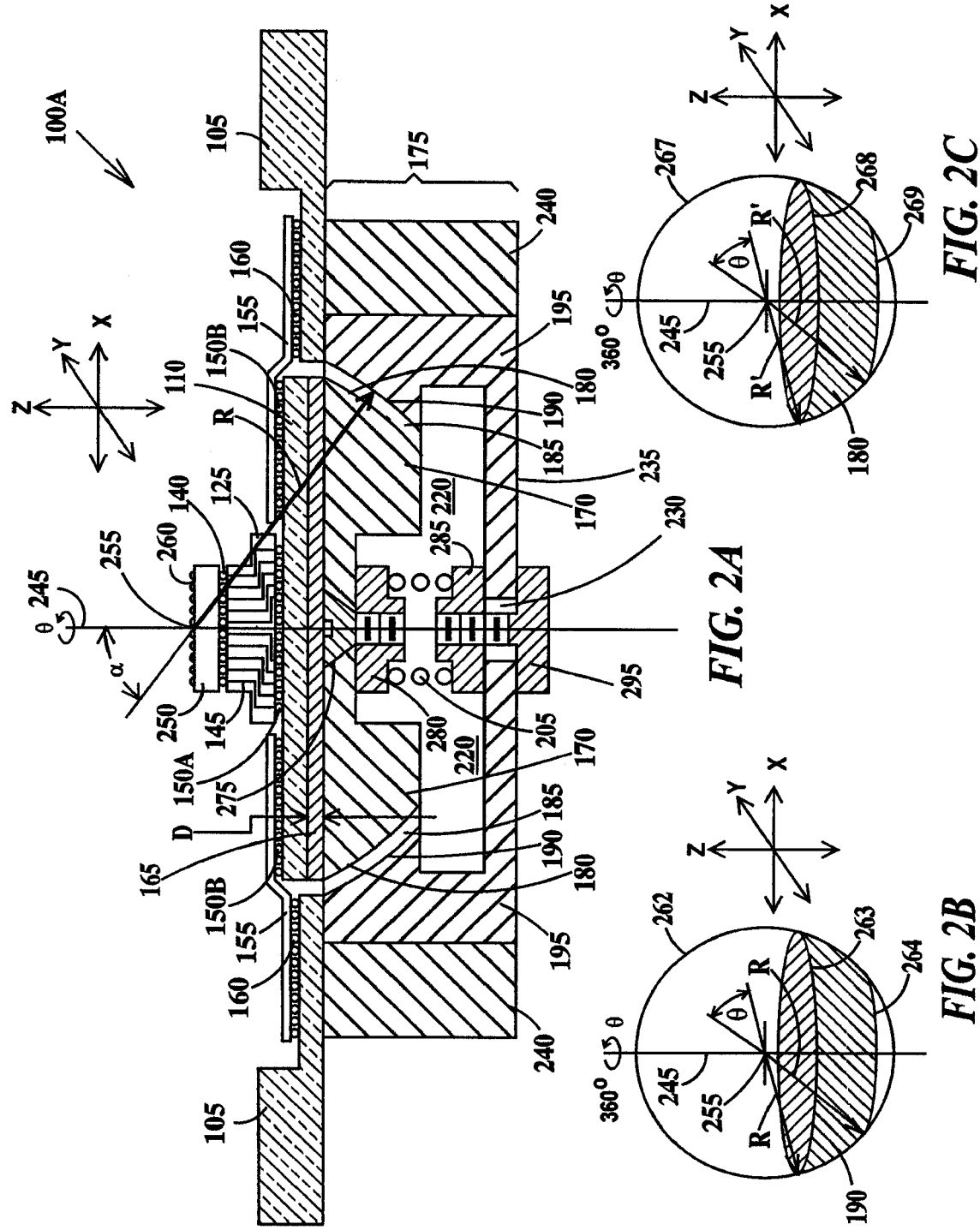
FIG. 2A is a cross-section view of a probe card assembly according to a first embodiment of the present invention.
FIGS. 2B and 2C are isometric drawing illustrating concentric spherical bearing surfaces of FIG. 2A.

FIG. 2A is a cross-section view of a probe card assembly according to a first embodiment of the present invention. In FIG. 2A, a probe card assembly 100A includes outer probe card 105, inner probe card 110, substrate 125 and upper contacts 140. Substrate 125 includes wires 145 electrically connecting upper contacts 140 to an array of corresponding inner contacts 150A of inner probe card 110 A flexible circuit 155 electrically connects an array of outer contact pads 150B of inner probe card 110 to an array of contact pads 160 of outer probe card 105. Flexible circuit 155 allows inner probe card 110 to move with respect to outer probe card 105. A flexible circuit is defined herein as a circuit board including an insulating substrate and electrically conductive wires that is capable of being bent repeatedly without injury or damage to the insulating substrate or electrically conductive wires.

Inner probe card 110 is mounted to a spacer 165. In one example, different spacers having different thicknesses D can be interchanged to different thicknesses of various probe card assembly components such as inner probe card 110, substrate 125, flexible circuit 155 and probe assembly 250 (discussed infra).

Spacer 165 is in turn mounted to an inner portion 170 of a semi-spherical gimbal bearing 175. A convex spherical surface 180 of inner portion 170 is held in slidable contact with a low friction coating 185 on a concave spherical surface 190 of an outer portion 195 of gimbal bearing 175. Alternatively, low friction coating 185 could be formed on surface 180 or a ring of low friction material conformal to and placed between surfaces 180 and 190 could be substituted for the low friction coating.

Contact pressure between inner portion 170 and outer portion 195 of gimbal bearing 175 is adjusted by a spring 205, attached between an upper threaded plate 280 and a lower threaded plate 285. A top screw 275 connects inner portion 170 of gimbal bearing 175 to upper threaded plate 280. An adjustment screw 295 is threaded into lower threaded plate 285. Top screw 275, spring 205, upper threaded plate 280, lower threaded plate 285 and adjustment screw 295 comprise a first example of an adjustable tensioning mechanism.

It should be noted that outer probe card 105, inner probe card 265, substrate 125, spacer 165, inner portion 170 and outer portion 195 of gimbal bearing 175, top screw 275, upper threaded plate 280, lower threaded plate 285, spring 205, adjustment screw 295 and probe assembly 250 are symmetrically disposed about vertical axis 245 passing through a center point 255 of the probe assembly. A radius R, extends from center point 255 to surface 190 of outer portion 195 of gimbal bearing 175. The dual sweep of radius R 360° in the θ direction about vertical axis 245 and within a range of angles defined by α defines the compound surface geometry of surface 190 and that of surface 180, using a radius equal to R minus the thickness of low friction coating 185. Surfaces 180 and 190 are thus concentric relative to center point 255.

Opening 230 in bottom wall 235 of outer portion 195 of gimbal bearing 175 is larger than the diameter of adjustment screw 295. With adjustment screw 295 loose in bottom threaded plate 285, adjustment screw 295 can be moved within the opening as inner portion 170 of gimbal bearing 175 tilts relative to outer portion 195 of gimbal bearing 175, thus allowing initial planarization of top surface 260 of probe assembly 250 to the datum of the test fixture portion of the tester (see FIG. 12). A datum is defined herein as a reference surface. When adjustment screw 295 is tightened, spring 205 flexes as inner portion 170 pivots relative to outer portion 195 of gimbal bearing 175 as probe assembly 250 contacts the I/O signal and power connection of the DUT. Thus, there is dynamic gimbal motion as the probe assembly contacts the DUT, providing for improved uniform probe contact force to all I/O signal and power connections.

Gimbal bearing 175 further includes an outer support ring 240. Outer probe card 105 is mounted to outer portion 195 and outer support ring 240 of gimbal bearing 175. A probe assembly 250 is mounted to substrate 125 and in electrical contact with contact pads 140.

Spring 205 also provides torsional rigidity about vertical axis 245 to limit rotation of inner probe card 110 in the Z-direction. Flexible circuit 155 also provides torsional rigidity about vertical axis 245.

In FIG. 2B, it may be seen that surface 190 is the surface of a sphere 262 between parallel small circles 263 and 264, both of which are within the same hemisphere of sphere 262, the radius R of sphere 262 centered on center point 255 of probe assembly 250 (see FIG. 260). A great circle of a sphere is defined herein as a section of the sphere that contains a diameter of the sphere. Sections of the sphere that do not contain a diameter are defined herein as small circles. In FIG. 2C, it may be seen that surface 180 is the surface of a sphere 267 between parallel small circles 268 and 269, both of which are in the same hemisphere of sphere 267, the radius R' of sphere 267 centered on center point 255 of probe assembly 250 (see FIG. 2A). R differs from R' by the thickness of low friction coating 185. Note R and R' are concentric.

Figure 10A:
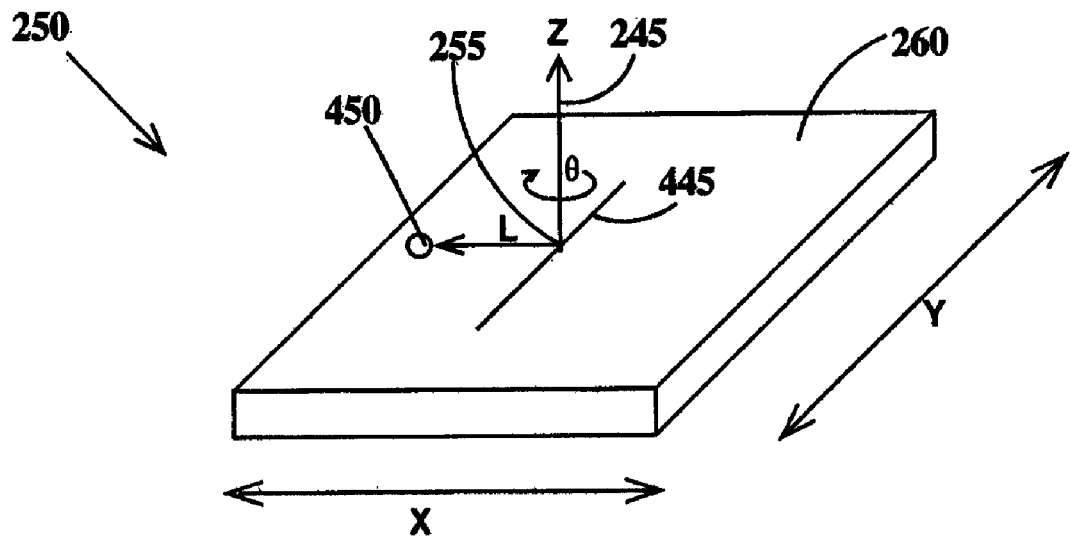
FIGS. 10A and 10B illustrate the degrees of freedom of a probe assembly according to the present invention.
Figure 10B:
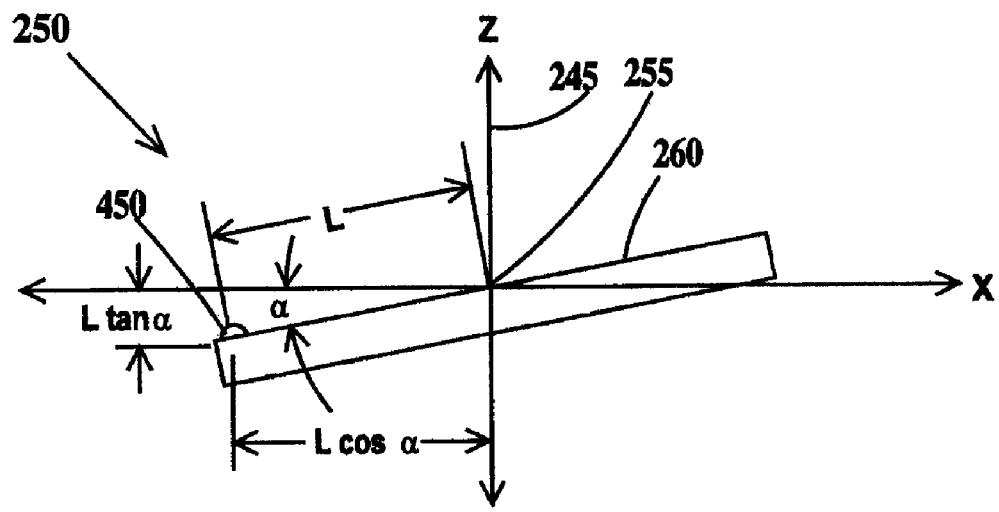

Gimbal bearing 175 constrains movement of inner probe card 110 (and also probe assembly 255) relative to outer probe card 105 to pivoting about center point 255 and does not allow any significant X direction (horizontal relative to top surface 260), significant Y direction (perpendicular to the X direction) or significant θ rotation (rotation about vertical axis 245) movement. A small amount of Z direction (orthogonal to both the X and Y directions, also defined movement along or parallel to vertical axis 245) occurs due to the geometries involved as illustrated in FIGS. 10A and 10B and described infra.

Figure 3:
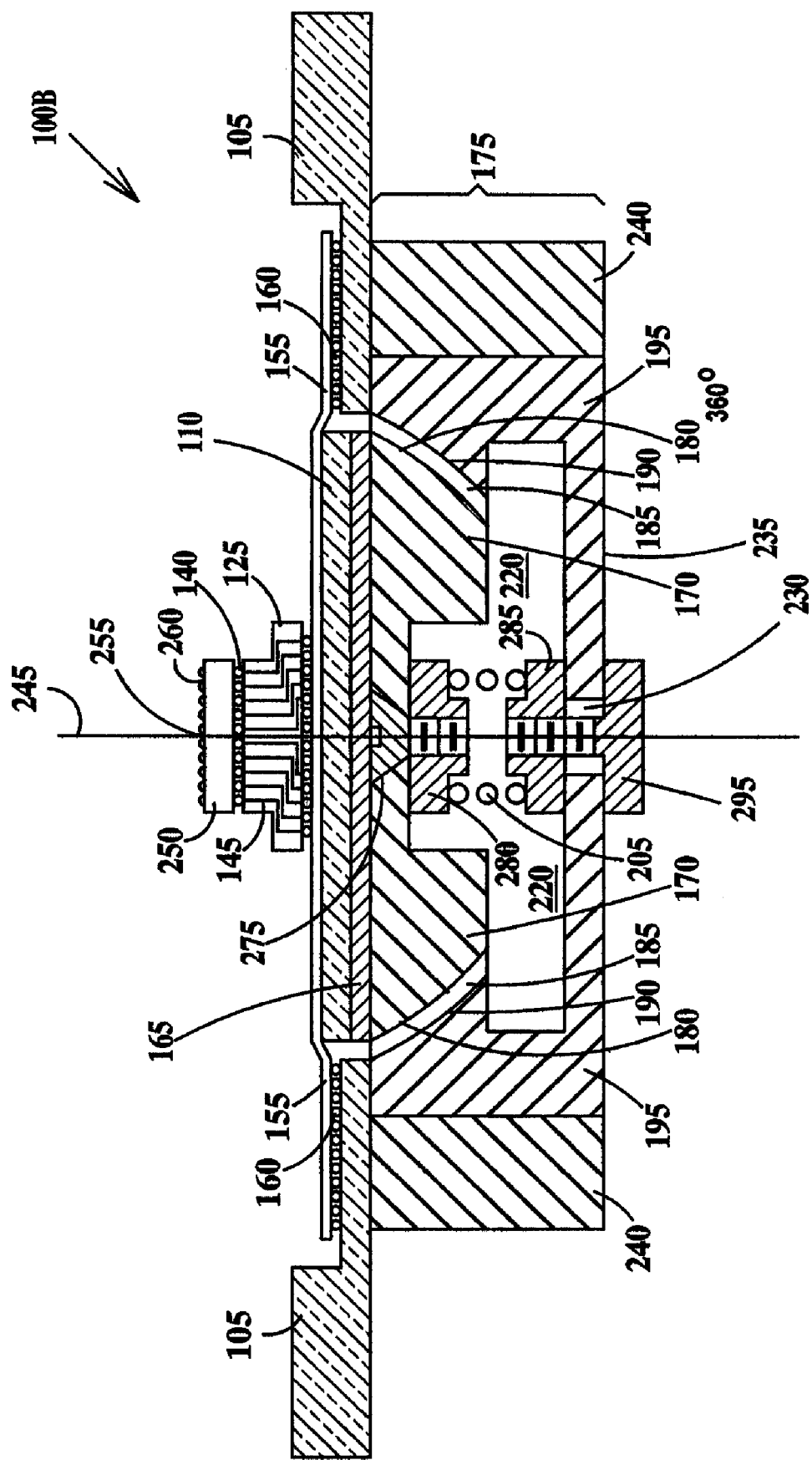
FIG. 3 is a cross-section view of a probe card assembly according to a second embodiment of the present invention.

FIG. 3 is a cross-section view of a probe card assembly according to a second embodiment of the present invention. In FIG. 3, a probe card assembly 100B is similar to probe card assembly 100A of FIG. 2A, except flexible circuit 155 is replaced with flexible circuit 260 and inner probe card 110 is replaced with an inner probe card 265. Inner probe card 265 need not have internal wiring as flexible circuit 260 provides the electrical connections between wires 145 in substrate and contact pads 160 of outer probe card 105 through an array of contact pads 270 and wires of flexible circuit 265.

While the third through eighth embodiments of the present invention will be illustrated using flexible circuit 260 and its corresponding interconnection scheme, it should be understood that flexible circuit 155 of FIG. 2A and its corresponding interconnection scheme may be substituted in all embodiments of the present invention.

Figure 4:
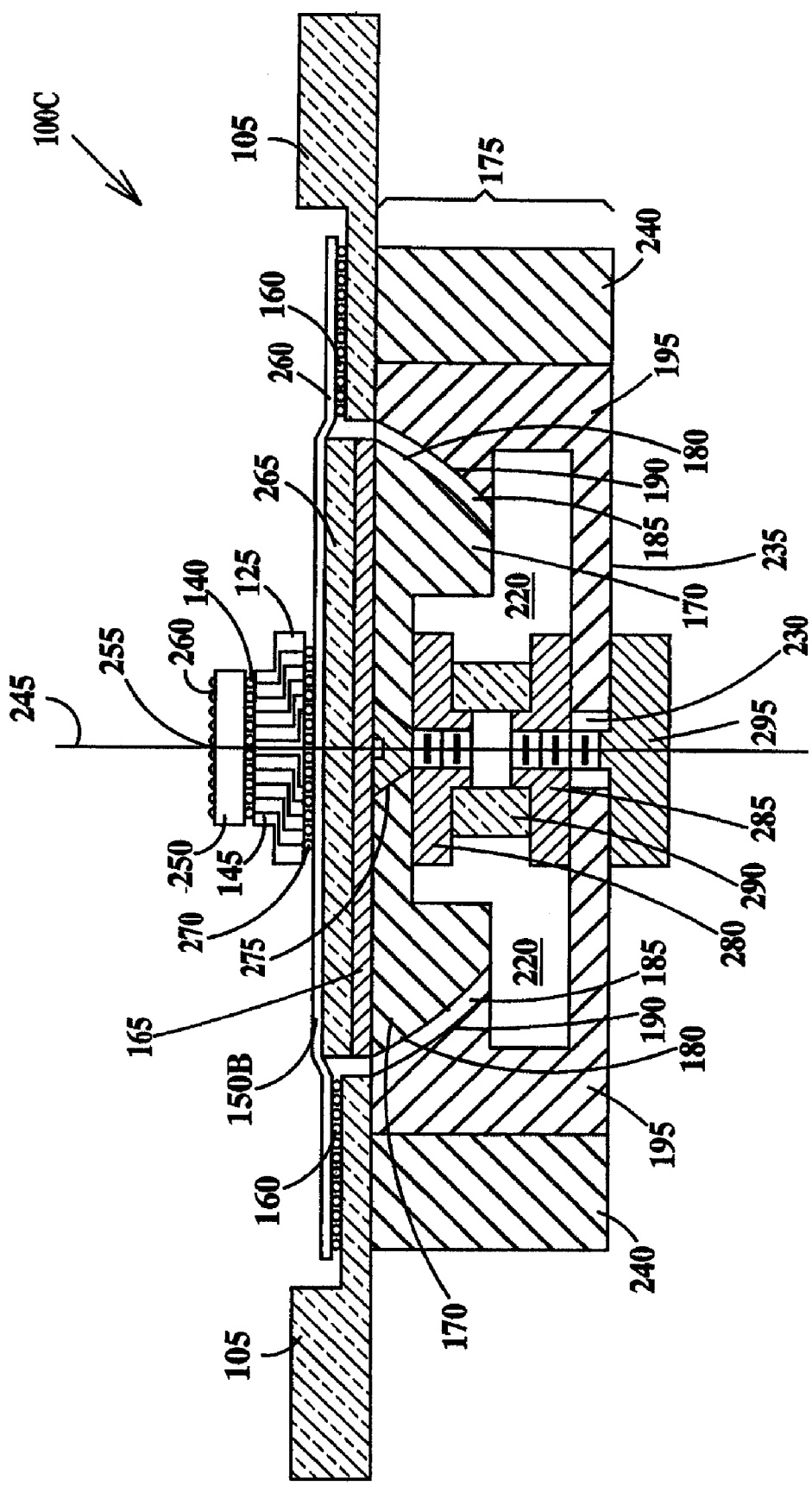
FIG. 4 is a cross-section view of a probe card assembly according to a third embodiment of the present invention.

FIG. 4 is a cross-section view of a probe card assembly according to a third embodiment of the present invention. In FIG. 4, a probe card assembly 100C is similar to probe card assembly 100B of FIG. 3A, except spring 205 is replaced with an elastic insert 290 attached to both the upper and lower threaded plates. Elastic insert 290 also provides torsional rigidity about vertical axis 245 to limit rotation of inner probe card 110 in the Z-direction. Top screw 275, elastic insert 290, upper threaded plate 280, lower threaded plate 285 and adjustment screw 295 comprise a second example of an adjustable tensioning mechanism.

While the fourth and eighth embodiments of the present invention will be illustrated using elastic insert 290 and its related components for connecting inner portion 170 and outer portion 195 of gimbal bearing 175 together, it should be understood that spring 155 of FIG. 2A and its related components for connecting inner portion 170 and outer portion 195 of gimbal bearing 175 together may be substituted in the fourth (FIG. 5A) and eighth (FIG. 9) embodiments. Likewise, elastic insert 290 and its related components for connecting inner portion 170 and outer portion 195 of gimbal bearing 175 together may be substituted for spring 155 of FIG. 2A and its related components for connecting inner portion 170 and outer portion 195 of gimbal bearing 175 together in the first (FIG. 2A) and second (FIG. 3) embodiments of the present invention.

FIG. 5A is a cross-section view of a probe card assembly according to a fourth embodiment of the present invention and FIG. 5B is an isometric cross-section illustrating a ball bearing assembly 300 of FIG. 5A. In FIG. 5A, a probe card assembly 100D is similar to probe card assembly 100C of FIG. 4, except a ball bearing assembly 300 (see FIG. 5B) including a retaining ring 305 and a multiplicity of ball bearings 310 is subsituted for low friction coating 185. Also the space between surfaces 180 and 190 is adjusted to accommodate the diameter of ball bearing 310, so each ball bearing just contacts both surfaces. Note, ball bearing assembly 300 may be substituted for low friction coating 185 in the first (FIG. 2A, second (FIG. 3) and third (FIG. 4) embodiments of the present invention. Likewise, low friction coating 185 may be substituted for ball bearings in the eighth (FIG. 9) embodiment of the present invention.

FIGS. 2B and 2C described infra, are applicable to the fourth embodiment of the present invention as well. The only modification required in the description of FIGS. 2A and 2B to make them applicable to FIG. 5A is that R differs from R' by the diameter of a ball bearing 310.

Before proceeding, the term compliance of a probe card assembly is next defined. Compliance of a probe card assembly is defined by the deflection of the tips of the probes of a probe assembly with respect to the datum of the probe card assembly at a specified probe pressure (or force). The datum (reference surface) of the probe card assembly must be parallel to or co-planer with the datum (reference surface) of the test fixture portion of the tester (see FIG. 13).

Figure 6:
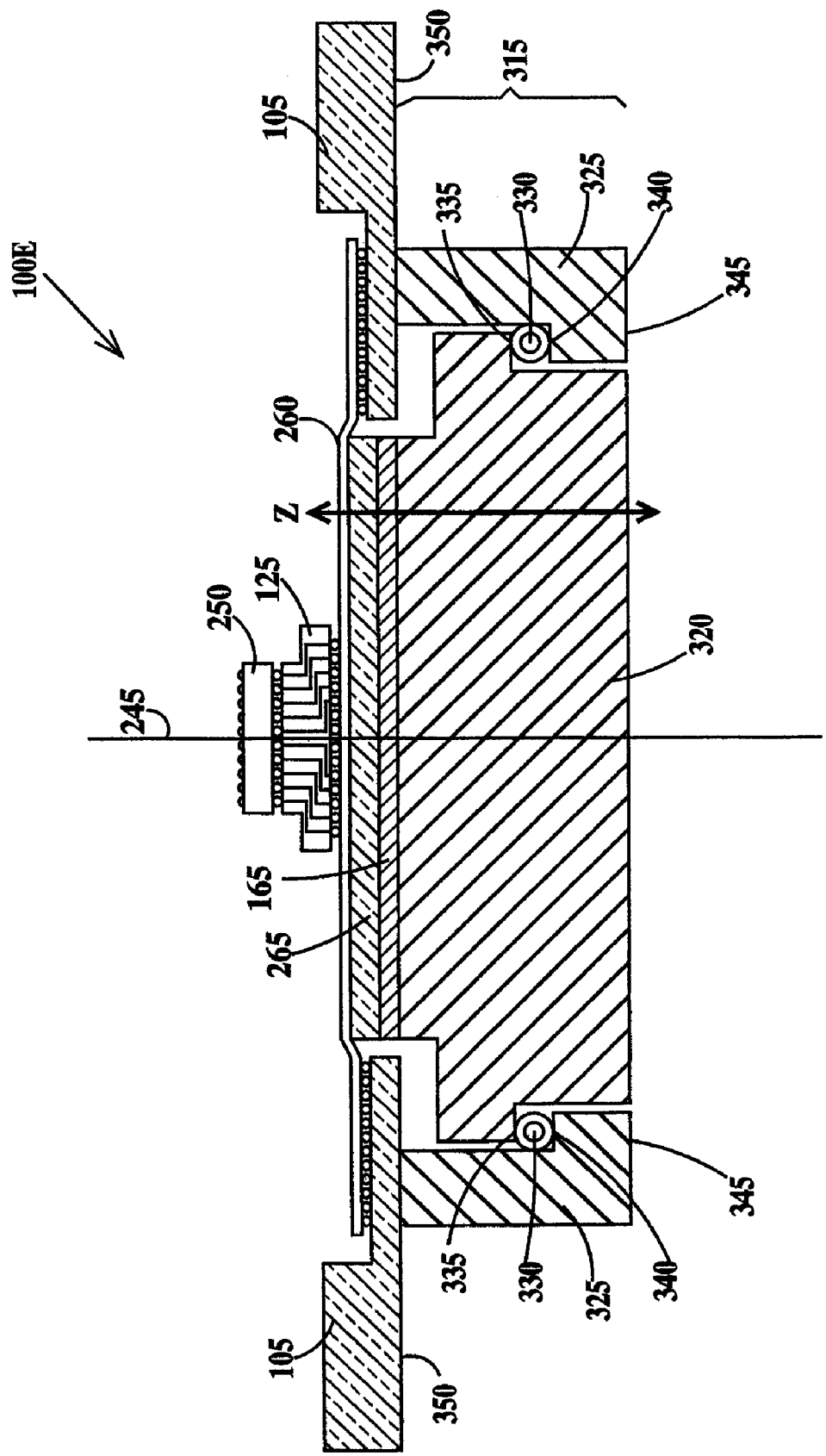
FIG. 6 is a cross-section view of a probe card assembly according to a fifth embodiment of the present invention.

FIG. 6 is a cross-section view of a probe card assembly according to a fifth embodiment of the present invention. In FIG. 6, a probe assembly 100E is similar to probe assembly 100D of FIG. 5A except gimbal bearing 175 has been replace with a compliance adjustment mechanism 315. Compliance adjustment mechanism 315 includes an inner cylinder 320 attached to spacer 165 and a hollow outer cylinder 325 attached to outer probe card 105. Inner cylinder 320 is disposed with outer cylinder 325 and is free to move in the Z direction. A hollow elastic O-ring is disposed between a lip 335 of inner cylinder 320 and a lip 340 of outer cylinder 325. The datum (reference surface) of probe card assembly 100E is a bottom surface 345 of outer cylinder 325 or a bottom surface 350 of outer probe card 105. Hollow O-ring 330 provides a predetermined amount of compliance. In a first example, by changing O-ring parameters such as material, inside diameter and outside diameter based on the I/O connector count of the DUT the pressure (and hence compliance) of probes on I/O connections of a DUT can be adjusted based on the I/O connector count of the DUT. In a second example, O-Ring 330 may be pressurized using a compressor coupled through a regulator, and the regulator pressure setting adjusted based on the I/O connector count of the DUT.

Alternatively, 0-ring 330 may re replaced by a set of springs, arranged in a equally spaced ring and positioned between lip 335 of inner cylinder 320 and lip 340 of outer cylinder 330.

Figure 7:
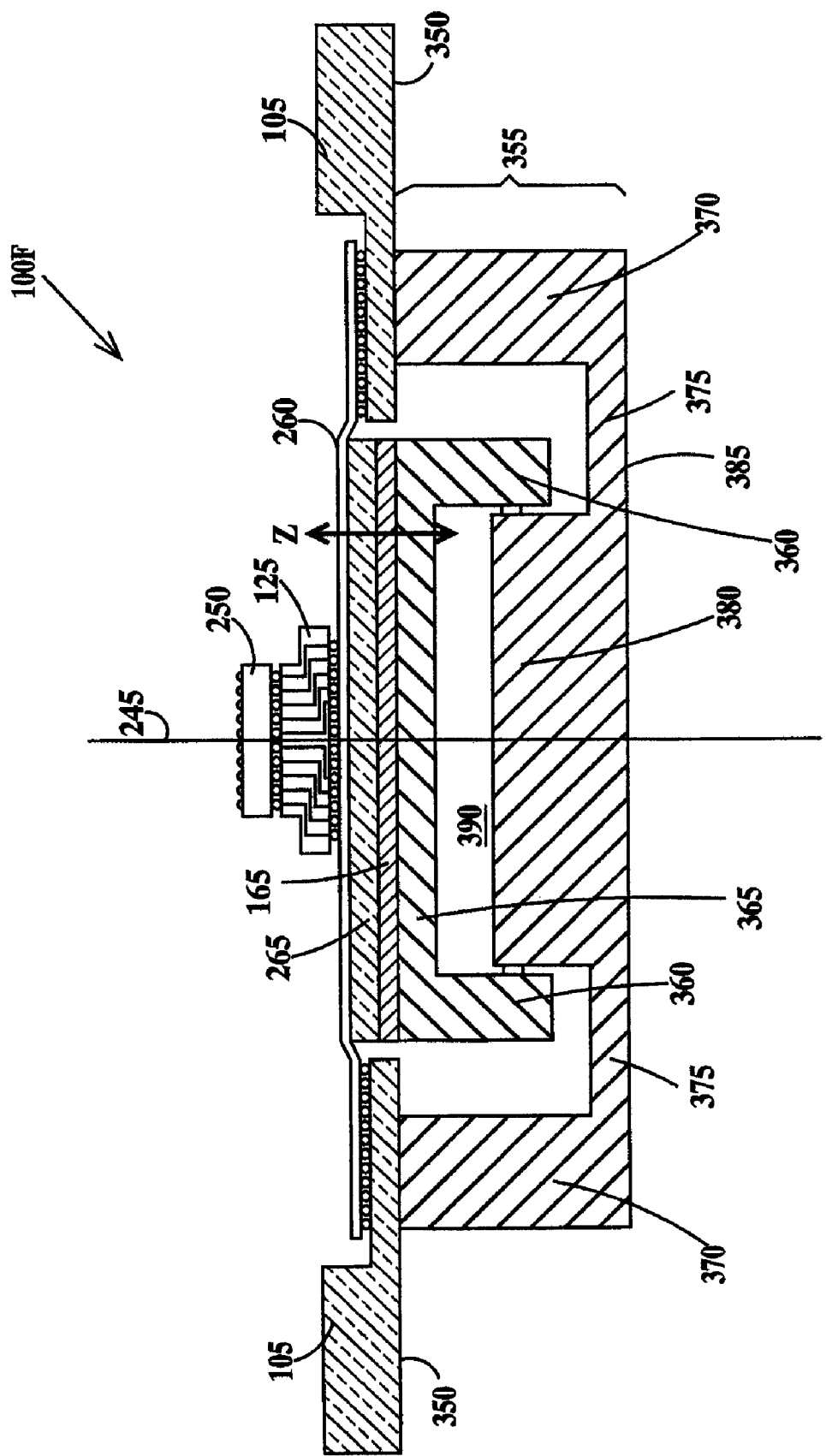
FIG. 7 is a cross-section view of a probe card assembly according to a sixth embodiment of the present invention.

FIG. 7 is a cross-section view of a probe card assembly according to a sixth embodiment of the present invention. In FIG. 7, a probe assembly 100F is similar to probe assembly 100E of FIG. 6 except compliance adjustment mechanism 315 has been replaced by compliance adjust mechanism 355. Compliance adjustment mechanism 355 includes an hollow inner cylinder 360 closed at a bottom 365 and attached to spacer 165 and an hollow outer cylinder 370 closed at a bottom 375 opposing bottom 365 of inner cylinder 360. Outer cylinder 370 includes an integral and centrally located circular raised piston 380. Inner cylinder 360 is moveably disposed around piston 380. Outer cylinder 360 is free to move in the Z direction. The datum (reference surface) of probe card assembly 100F is a bottom surface 385 of outer cylinder 370 or bottom surface 350 of outer probe card 105. A void 390 formed between inner cylinder 365 and piston 380 is pressurized by a compressor through a regulator. The regulator pressure setting adjusted is based on the I/O connector count of the DUT to give the required compliance based on I/O connector counts.

Figure 8:
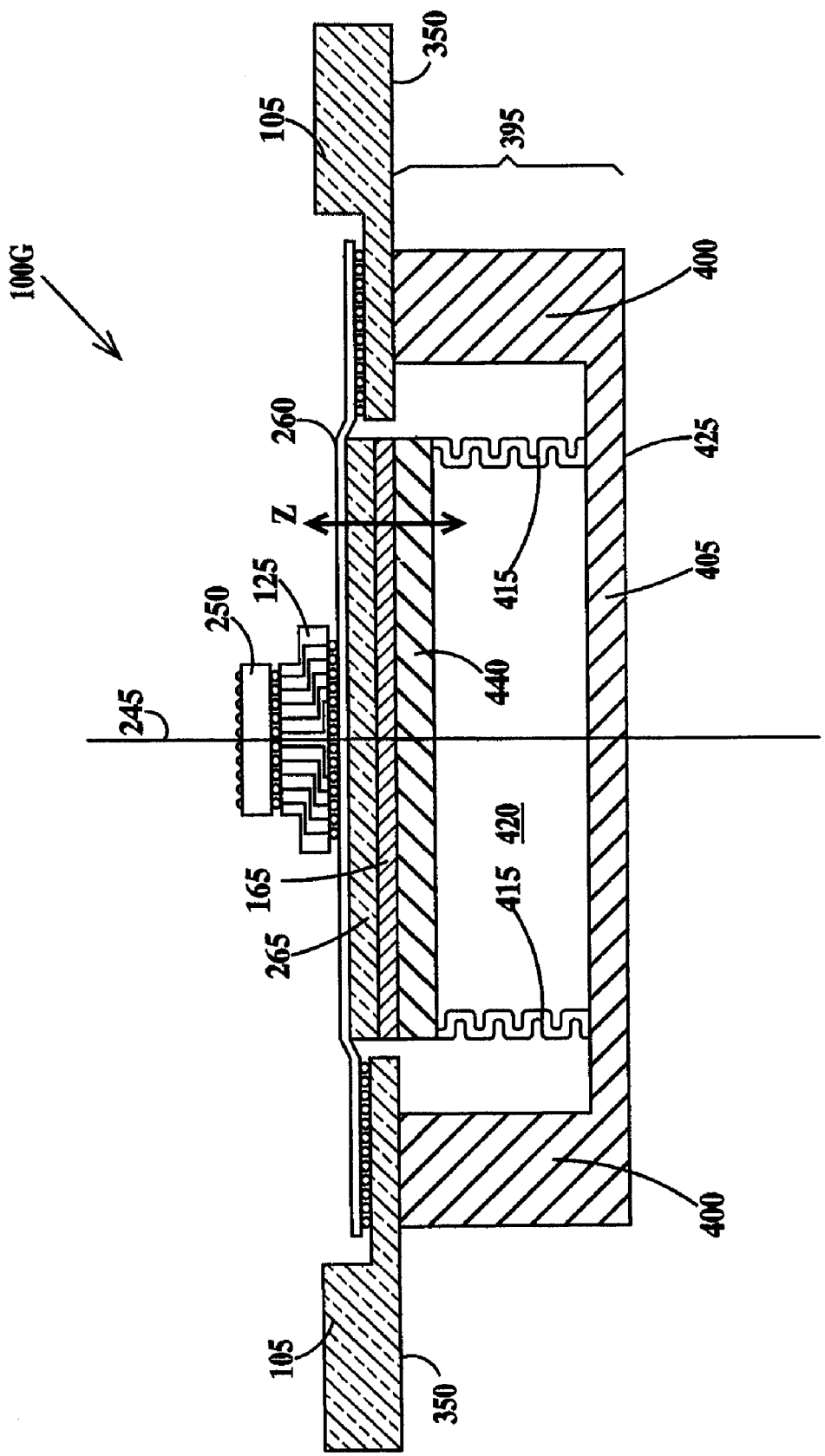
FIG. 8 is a cross-section view of a probe card assembly according to a seventh embodiment of the present invention.

FIG. 8 is a cross-section view of a probe card assembly according to a seventh embodiment of the present invention. In FIG. 8, a probe assembly 100G is similar to probe assembly 100E of FIG. 6 except compliance adjustment mechanism 315 has been replaced by compliance adjust mechanism 395. Compliance adjustment mechanism 395 includes an hollow outer cylinder 400 closed at a bottom 405 and attached to outer probe card 105 and disk 410 is attached to spacer 165. A bellows 415 connects bottom 405 of outer cylinder 400 to disk 410 forming a void 420. Disk 410 is free to move in the Z direction. The datum (reference surface) of probe card assembly 100F is a bottom surface 425 of outer cylinder 400 or bottom surface 350 of outer probe card 105. Void 420 is pressurized by a compressor through a regulator. The regulator pressure setting may be adjusted based on the I/O connector count of the DUT to give the required compliance. While compliance is adjustable it may or may not be the same for all DUTs regardless of I/O connector count.

Figure 9:
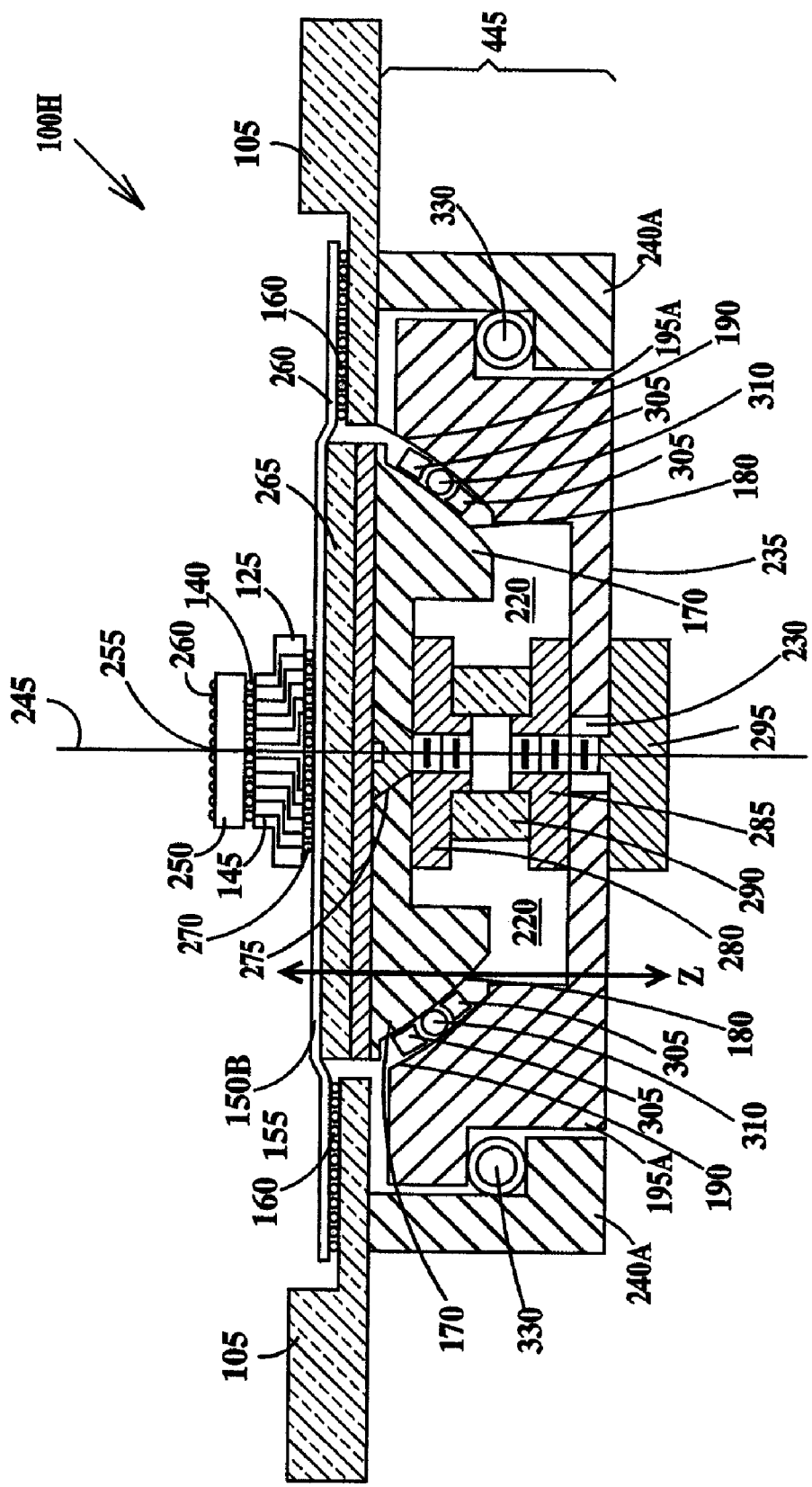
FIG. 9 is a cross-section view of a probe card assembly according to an eighth embodiment of the present invention.

FIG. 9 is a cross-section view of a probe card assembly according to an eighth embodiment of the present invention. In FIG. 9, a probe card assembly 100H is similar to probe card assembly 100D of FIG. 5A, except gimbal assembly 175 has been replaced with combination gimbal assembly and compliance mechanism 445. Also outer support ring 240A and outer portion 195A of gimbal bearing 175 have been modified to accept O-ring 330. Thus the gimbal components can be moved in the Z direction.

While probe card assembly 100H has been illustrated using compliance mechanism 315, compliance mechanisms 355 of FIG. 7 or 395 of FIG. 8 may be substituted. FIGS. 10A and 1B illustrate the degrees of freedom of probe assembly 250 according to the present invention.

FIG. 10A is an isometric view and FIG. 10B is a side view of probe assembly 250. In FIG. 10A, vertical axis 245 defines the Z-direction, with the X and Y directions being orthogonal to each other and to the Z direction. The θ direction is defined as rotation about the Z direction (or vertical axis 245). L is a vector to an arbitrary probe tip 450 protruding above surface 260 of probe assembly 250.

In FIG. 10B, surface 260 has been tilted through an angle α through an arbitrary axis 445 (see FIG. 10A). Applying simple geometry to FIG. 10B, it can be shown that probe tip 450 moves a distance L tan α in the Z direction, and a distance L(1−cos α) in a plane defined by the X any directions. In FIG. 10B it is assumed that the thickness of spacer 165 (see, for example, FIG. 2A) has been selected such that axis 445 is on surface 260. By moving axis 445 up and down along vertical axis 245 (by changing the thickness of spacer 165 (see, for example, FIG. 2A) the distance L tan α can be adjusted so as to increase or decrease scrub of the probe tips against the test pads of the DUT. Scrub is movement of the probe tips in the X and Y directions and is useful for mechanically breaking through oxide layers that may have formed on the test pads in order to decrease contact resistance between the probe tip and the test pad.

Figure 11A:
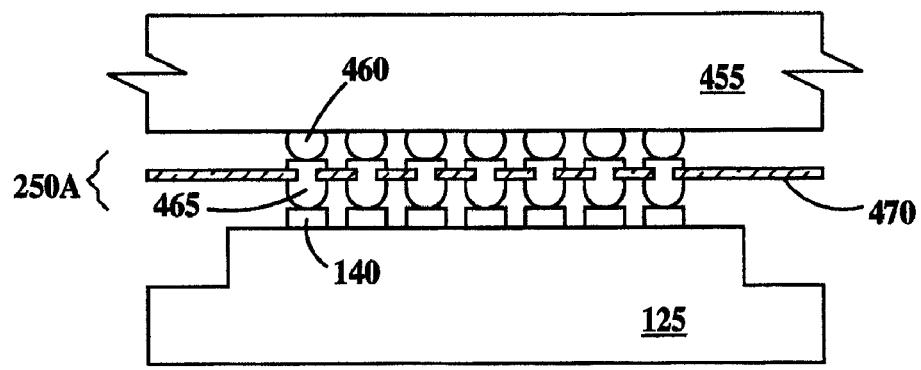
FIG. 11A is a cross-section view of a rigid probe assembly that may be used with the probe card assemblies of the present invention.

FIG. 11A is a cross-section view of a rigid probe assembly that may be used with the probe card assemblies of the present invention. In FIG. 11A, an integrated circuit chip 455 includes a multiplicity of solder bumps 460. Solder bumps are also known as controlled collapse chip connections (C4s). Solder bumps 460 should be considered exemplary and other types of chip interconnects, such as pads, solder balls (and ball grid arrays in general) and solder columns may be substituted for solder bumps 460. A probe assembly 250A provides electrical contact between solder bumps 460 and upper contacts 140 of substrate 125 through corresponding electrically conductive probe tips 465 fitted into and protruding from both sides of a flexible tape 470. Probe assembly 250A is exemplary of rigid probe assemblies in general and a class of rigid probe assemblies called thin film probe assemblies in particular. A rigid probe assembly is defined herein as a probe assembly in which the probes do not significantly deform when in pressure contact with the I/P interconnects of the DUT.

Figure 11B:
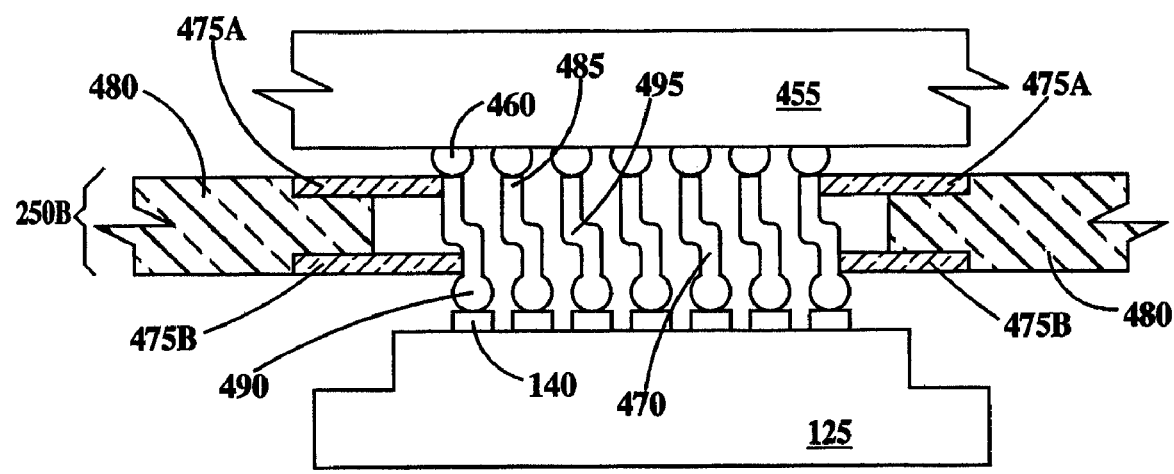
FIG. 11B is a cross-section view of a compliant probe assembly that may be used with the probe card assemblies of the present invention.

FIG. 11B is a cross-section view of a compliant probe assembly that may be used with the probe card assemblies of the present invention. In FIG. 11B, integrated circuit chip 455 includes solder bumps (or C4s) 460. Again solder bumps 460 should be considered exemplary and other types of chip interconnects, such as pads, solder balls (and ball grid arrays in general) and solder columns may be substituted for solder bumps 460. A probe assembly 250B provides contact between solder bumps 460 and upper contacts 140 of substrate 125 through corresponding electrically conductive jogged probe s 470 fitted between insulator frames 475A and 475B held together by a ring 480. Probe tips 485 of probes 470 protrude from frame 475A and electrically contact solder bumps 460. Bulbous ends 490 of probes 470 extend from frame 475B and electrically contact upper contacts 140 of substrate 125. Jog 495 in each probe 470 allows probe tips 485 of individual probes to move in the X-Y and Z directions that were described supra. Probe assembly 250B is exemplary of compliant probe assemblies in general and a class of compliant probe assemblies called cobra probe assemblies in particular. A compliant probe assembly is defined herein as a probe assembly in which the probes do will deform when in pressure contact with the I/P interconnects of the DUT and regain their original configuration after the pressure is released.

Figure 12:
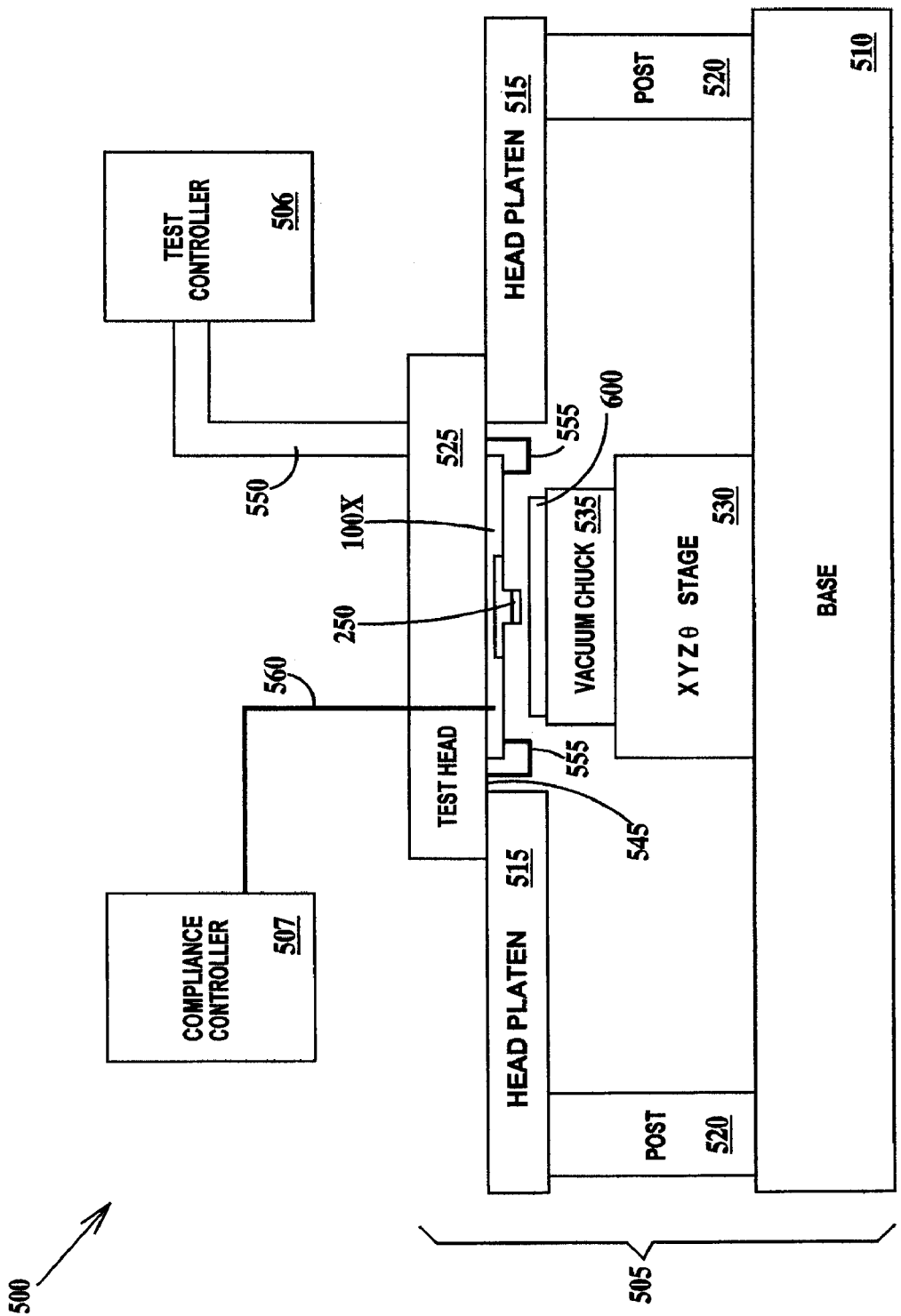
FIG. 12 is a side view diagram of a tester that may be with the probe card assemblies of the present invention.

FIG. 12 is a side view diagram of a tester that may be used with the probe card assemblies of the present invention. In FIG. 12, a tester 500, includes a test fixture 505, a test controller 506 and an optional compliance controller 507. Test fixture 505 includes a base 510 and a head platen 515 connected to base 510 by posts 520. Test fixture 505 further includes a test head 525, an XYZθ stage 530 (well known in the art) and a vacuum chuck 535 (a clamp mechanism may be substituted) for clamping an integrated circuit wafer 600, having a multiplicity of integrated circuit chips, in place. XYZθ stage 530 is mounted to base 510 and vacuum chuck 535 is mounted to XYZθ stage 530. Test head 525 is mounted to a top surface 540 of head platen 515. A probe card assembly 100X according to any of the first through eighth embodiments of the present invention is mounted to a bottom surface 545 of test head 525. Mounted on probe card assembly 100X is probe assembly 250. Bottom surface 545 is also the datum of test fixture 505. A multiple electrical conductor cable 550 connects test head 525 to test controller 506. Multiple electrical conductor cables 555 connect probe card assembly 100X to test head 525. An optional tube 560 connects optional compliance controller 507 to probe card assembly 100X in the event that the probe card assembly utilizes a compliance mechanism requiring a pressurizing fluid.

In operation, XYZθ stage 530 moves a integrated circuit chip on wafer 600 under and aligned to probe assembly 250 and then raises the wafer so solder bumps on the integrated circuit chip contact the probe tips of the probe assembly. The Z-direction travel defines the first order compliance of the tester. Optional controller 510 can then modify the first order compliance as described supra.

Thus, the present invention provides improved probe card assemblies. The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, the apparatus and method of the present invention may be applied to testing individual integrated circuit chips, diced from wafers or substrates and modules used in packaging integrated circuit chips. Therefore, it is intended that the following claims cover all such modifications and changes as fall within the true spirit and scope of the invention.

The invention claimed is:

1. An apparatus, comprising:
a probe array mounted on an inner portion of a gimbaled bearing, said inner portion of said gimbaled bearing having a spherical surface defined by a surface of a first sphere between two parallel small circles of said first sphere, a radius of said first sphere centered on a point on a top surface of said probe array; and
an outer portion of said gimbaled bearing, said outer portion of said gimbaled bearing having a spherical surface defined by the surface of a second sphere between two parallel small circles of said second sphere, a radius of said second sphere centered on said point on said top surface of said probe array.

2. The apparatus of claim 1,
wherein said spherical surface of said inner portion of said gimbaled bearing and said spherical surface of said outer portion of said gimbaled bearing are concentric and separated by a layer that reduces friction between said spherical surface of said inner portion of said gimbaled bearing and said spherical surface of said outer portion of said gimbaled bearing; and
further including an adjustable tensioning mechanism connecting said inner portion of said gimbaled bearing and said outer portion of said gimbaled bearing.

3. The apparatus of claim 1,
wherein said spherical surface of said inner portion of said gimbaled bearing and said spherical surface of said outer portion of said gimbaled bearing are concentric and separated by ball gimbaled bearings; and
further including an adjustable tensioning mechanism connecting said inner portion of said gimbaled bearing and said outer portion of said gimbaled bearing.

4. The apparatus of claim 1, wherein movement of said top surface of said probe array is constrained to tilting about any line passing through said point on said top surface of said probe array.

5. The apparatus of claim 1, further including:
an inner probe card and an outer probe card, said inner probe card intervening between said probe array and a top surface of said inner portion of said gimbaled bearing, said outer probe card mounted to atop surface of said outer portion of said gimbaled bearing.

6. The apparatus of claim 5, further including:
a flexible circuit electrically connecting said inner probe card to said outer probe card.

7. The apparatus of claim 1, wherein said probe array is a rigid probe array or a compliant probe array.

8. The apparatus of claim 1, further including means for adjusting a pressure of said probe array on I/O interconnects of a device under test.

9. The apparatus of claim 8, wherein said means for adjustiiig is selected from the group consisting of a hollow O-ring positioned between a support ring and said outer portion of said gimbaled bearing, a pressurized and pressure adjustable hollow O-ring positioned between said support ring and said outer portion of said gimbaled bearing, a pressurized and pressure adjustable piston positioned between said support ring and said outer portion of said gimbaled bearing, a pressurized and pressure adjustable bellows positioned between said support ring and said outer portion of said gimbaled bearing, and a circular array of equidistance spaced springs positioned between said support ring and said outer portion of said gimbaled bearing.

10. The apparatus of claim 1, further including means for adjusting an alignment of said top surface of said probe array to a reference surface of a test fixture in which said probe array and gimbaled bearing are mounted.

11. A method of testing, comprising:
providing a probe array;
providing a gimbaled bearing, an inner portion of said gimbaled bearing having a spherical surface defined by the surface of a first sphere between two parallel small circles of said first sphere, a radius of said first sphere centered on a point on a top surface of said probe array; and an outer portion of said gimbaled bearing, said outer portion of said gimbaled bearing having a spherical surface defined by the surface of a second sphere between two parallel small circles of said second sphere, a radius of said second sphere centered on said point on said top surface of said probe array;
mounting said probe array on an inner portion of said gimbaled bearing; and
contacting I/O connections of a device under test with said probe array.

12. The method of claim 11,
wherein said spherical surface of said inner portion of said gimbaled bearing and said spherical surface of said outer portion of said gimbaled bearing are concentric and separated by a layer that reduces friction between said spherical surface of said inner portion of said gimbaled bearing and said spherical surface of said outer portion of said gimbaled bearing; and
further including providing an adjustable tensioning mechanism connecting said inner portion of said gimbaled bearing and said outer portion of said gimbaled bearing and adjusting a force pressing said spherical surface of said inner portion of said gimbaled bearing toward said spherical surface of said outer portion of said gimbaled bearing.

13. The method of claim 11,
wherein said spherical surface or said inner portion of said gimbaled bearing and said spherical surface of said outer portion of said gimbaled bearing are concentric and separated by ball gimbaled bearings; and
further including providing an adjustable tensioning mechanism connecting said inner portion of said gimbaled bearing and said outer portion of said gimbaled bearing and adjusting a force pressing said spherical surface of said inner portion of said gimbaled bearing toward said spherical surface of said outer portion of said gimbaled bearing.

14. The method of claim 11, wherein movement of said top surface of said probe array is constrained to tilting about any line passing through said point on said top surface of said probe array.

15. The method of claim 11, further including:
providing an inner probe card and providing an outer probe card, said inner probe card intervening between said probe array and a top surface of said inner portion of said gimbaled bearing, said outer probe card mounted to a top surface of said outer portion of said gimbaled bearing.

16. The method of claim 15, further including:
providing a flexible circuit electrically connecting said inner probe card to said outer probe card.

17. The method of claim 11, wherein said probe array is a rigid probe array or a compliant probe array.

18. The method of clam, 11, further including providing means for adjusting a pressure of said probe array on said I/O interconnects of said device under test.

19. The method of claim 18, wherein said means for adjusting is selected from the group consisting of a hollow O-ring positioned between a support ring and said outer portion of said gimbaled bearing, a pressurized and pressure adjustable hollow O-ring positioned between said support ring and said outer portion of said gimbaled bearing, a pressurized and pressure adjustable piston positioned between said support ring and said outer portion of said gimbaled bearing, a pressurized and pressure adjustable bellows positioned between said support ring and said outer portion of said gimbaled bearing, and a circular array of equidistance spaced springs positioned between said support ring and said outer portion of said gimbaled bearing.

20. The method of claim 11, further including providing means for adjusting an alignment of said top surface of said probe array to a reference surface of a test fixture in which said probe array and gimbaled bearing are mounted.

21. An apparatus, comprising:
a probe array mounted on an inner portion of a bearing, said inner portion of said bearing slidably mounted to an outer portion of said bearing, said inner bearing able to move in a direction perpendicular to a top surface of said probe array; and
contact pressure adjusting means for dynamically adjusting a pressure of said probe array on I/O interconnects of a device under test, said contact pressure adjusting means selected from the group consisting of an internally and adjustably fluid pressurized hollow O-ring positioned between said inner portion of said bearing and said outer portion of said bearing, an adjustably fluid pressurized piston positioned between said inner portion of said bearing and said outer portion of said bearing, an adjustably fluid pressurized bellows position between said inner portion of said bearing and said outer portion of said bearing, and a circular array of equidistance spaced springs positioned between said inner portion of said bearing and said outer portion of said bearing.

22. The apparatus of claim 21, farther including:
an inner probe card and an outer probe card, said inner probe card intervening between said probe array and a top surface of said inner portion of said bearing, said outer probe card mounted to a top surface of said outer portion of said bearing.

23. The apparatus of claim 22, further including:
a flexible circuit electrically connecting said inner probe card to said outer probe card.

24. The apparatus of claim 21, wherein said probe array is a rigid probe array.

25. The apparatus of claim 21, wherein said probe array is a compliant probe array.

26. A method of testing, comprising:
providing a probe array;
providing a bearing, an inner portion of said bearing slidably mounted to an outer portion of said bearing; said inner bearing able to move in a direction perpendicular to a top surface of said probe array;
providing contact pressure adjusting means for dynamically adjusting a pressure of said probe array on I/O interconnects of a device under test, said contact pressure adjusting means selected from the group consisting of an internally and adjustably fluid pressurized hollow O-ring positioned between said inner portion of said bearing and said outer portion of said bearing, an adjustably fluid pressurized piston positioned between said inner portion of said bearing and said outer portion of said bearing, an adjustably fluid pressurized bellows positioned between said inner portion of said bearing and said outer portion of said bearing, and a circular array of equidistance spaced springs positioned between said inner portion of said bearing and said outer portion of said bearing;
mounting said probe array to said inner portion of said bearing; and
contacting I/O connections of a device under test with said probe array.

27. The method of claim 26, wherein said means for dynamically adjusting is selected from the group consisting of a hollow O-ring positioned between said inner portion of said bearing and said outer portion of said bearing, a pressurized and pressure adjustable hollow O-ring positioned between said inner portion of said bearing and said outer portion of said bearing, a pressurized and pressure adjustable piston positioned between said inner portion of said bearing and said outer portion of said bearing, a pressurized and pressure adjustable bellows positioned between said inner portion of said bearing and said outer portion of said bearing, and a circular array of equidistance spaced springs positioned between said inner portion of said bearing and said outer portion of said bearing.

28. The method of claim 26, further including;
providing an inner probe card and providing an outer probe card, said inner probe card intervening between said probe array and a top surface of said inner portion of said bearing, said outer probe card mounted to a top surface of said outer portion of said bearing.

29. The method of claim 28, further including:
providing a flexible circuit electrically connecting said inner probe card to said outer probe card.

30. The method of claim 26, wherein said probe array is a rigid probe array.

31. The method of claim 26, wherein said probe array is a compliant probe array.

* * * * *

UNITED STATES PATENT AND TRADEMARK OFFICE
CERTIFICATE OF CORRECTION

PATENT NO. : 7,084,651 B2  Page 1 of 1
APPLICATION NO. : 10/710677
DATED : August 1, 2006
INVENTOR(S) : Audette et al.

It is certified that error appears in the above-identified patent and that said Letters Patent is hereby corrected as shown below:

Column 9
Line 17 delete "atop" and insert --a top--

Column 11
Line 6 delete "position" and insert --positioned--

Signed and Sealed this

Fourteenth Day of November, 2006

JON W. DUDAS
*Director of the United States Patent and Trademark Office*